United States Patent
Alexander

(10) Patent No.: US 8,836,647 B2
(45) Date of Patent: Sep. 16, 2014

(54) NON-LINEAR RESISTIVE TOUCH SENSOR

(75) Inventor: Douglas Ulrich Alexander, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 691 days.

(21) Appl. No.: 12/442,208

(22) PCT Filed: Sep. 19, 2007

(86) PCT No.: PCT/IB2007/053793
§ 371 (c)(1),
(2), (4) Date: Mar. 20, 2009

(87) PCT Pub. No.: WO2008/038191
PCT Pub. Date: Apr. 3, 2008

(65) Prior Publication Data
US 2009/0315845 A1 Dec. 24, 2009

(30) Foreign Application Priority Data

Sep. 26, 2006 (EP) ..................................... 06121265

(51) Int. Cl.
*G06F 3/045* (2006.01)
(52) U.S. Cl.
USPC ....................................................... 345/173
(58) Field of Classification Search
CPC ..... G06F 1/1647; G06F 1/1673; G06F 1/169; G06F 1/16922; G06F 3/045; H03K 17/962; H03K 17/9645; H03K 17/9657; H03K 2017/96–2017/9611
USPC .................................................. 345/173–178
See application file for complete search history.

(56) References Cited

U.S. PATENT DOCUMENTS

| | | | |
|---|---|---|---|
| 6,288,707 B1 * | 9/2001 | Philipp | 345/168 |
| 6,826,968 B2 | 12/2004 | Manaresi et al. | |
| 2002/0093489 A1 * | 7/2002 | Kaikuranta et al. | 345/169 |
| 2002/0170167 A1 * | 11/2002 | Schrum et al. | 29/612 |
| 2003/0189552 A1 * | 10/2003 | Chuang et al. | 345/173 |
| 2004/0104826 A1 | 6/2004 | Philipp | |
| 2005/0052429 A1 | 3/2005 | Philipp | |
| 2006/0132462 A1 * | 6/2006 | Geaghan | 345/173 |
| 2007/0247438 A1 * | 10/2007 | Ryynanen et al. | 345/173 |

OTHER PUBLICATIONS

Written Opinion of the International Searching Authority for International Application No. PCT/IB2007/053793.

* cited by examiner

*Primary Examiner* — Chanh Nguyen
*Assistant Examiner* — Sanghyuk Park

(57) ABSTRACT

A touch sensor has a support layer (12) of an insulating material and a resistive layer (13) applied to the support layer. A resistive material is shaped according to an elongated pattern forming a sequence of touch positions, and has a single terminal (16) to be coupled to a sense input (17) of a detecting device (11), while an open end (15) of the sequence opposite to the terminal end remains unconnected. The detecting device detects an active resistance ($R_p$) between the single terminal and one of said touch positions that is touched by a user via a return capacitance constituted ($C_u$) by the user and a mass element (18) coupled to the detecting device. Advantageously only a single terminal is necessary, whereas a number of touch positions can be discriminated.

10 Claims, 5 Drawing Sheets

NON-LINEAR RESISTIVE TOUCH SENSOR

FIELD OF THE INVENTION

The invention relates to a touch sensor comprising a support layer of an insulating material and a resistive layer applied to the support layer.

The invention further relates to a method of manufacturing the touch sensor.

The invention further relates to a detecting device for cooperating with the touch sensor.

The invention relates to the field of sensors to be touched by an object, typically a user's finger, for operating electronic devices. The sensor may be positioned on the surface of an object, e.g. a consumer device, or may be integrated in textile for constituting a wearable user interface to a personal mobile unit.

BACKGROUND OF THE INVENTION

The document US 2005/0052429 describes a capacitive position sensor for detecting the position of an object, typically an operator's finger, relative to a resistive sensing element. The sensing element comprises a sensing path that has terminals connected along it that subdivide the sensing path into multiple sections. Each terminal is coupled to its own sensing channel, each of which generates a signal that is sensitive to the capacitance between its terminal and a system ground. The signals are fed to a processor for analysis. The processor determines over which section the object is positioned by comparing the signals from the sensing channels, and determines the position of the object within that section by comparing the signals from the terminals spanning that section. In this way, the sensing path can be formed in a closed loop, such as a circle for a scroll dial, in which the operator's finger position and movement can be uniquely determined in a straightforward manner.

SUMMARY OF THE INVENTION

The document US 2005/0052429 provides an example of a touch sensor requiring various sensing channels. In particular a resistive sensing element is to be connected at both ends for detecting the position of the object that touches. However, providing a number of terminals and corresponding sensing channels is complex and expensive.

It is an object of the invention to provide a touch sensor and detecting device that is less complex.

For this purpose, according to a first aspect of the invention, in the touch sensor as described in the opening paragraph, the resistive layer is constituted by a resistive material shaped according to an elongated pattern forming a sequence of touch positions, the elongated pattern having, at a connectable end of the sequence, a single terminal arranged to be coupled to a sense input of a detecting device, while an open end of the sequence opposite to the connectable end of the sequence remains unconnected, the detecting device being arranged to detect an active resistance between the single terminal and one of said touch positions that is touched by a user via a return capacitance constituted by the user and a mass element coupled to the detecting device.

For this purpose, according to a second aspect of the invention, the method as described in the opening paragraph comprises the steps of providing a support layer of an insulating material; applying a resistive layer to the support layer; and, for constituting the resistive layer, shaping a resistive material according to an elongated pattern forming a sequence of touch positions; and providing, at a connectable end of the sequence, a single terminal arranged to be coupled to an input of a detecting device, while an open end of the sequence opposite to the connectable end of the sequence remains unconnected, the detecting device being arranged to detect a resistance between the single terminal and one of said touch positions that is touched by a user via a return capacitance constituted by the user and a mass element coupled to the detecting device.

For this purpose, according to a third aspect of the invention, the detecting device as described in the opening paragraph is arranged for cooperating with a touch sensor that comprises a support layer of an insulating material and a resistive layer applied to the support layer, the resistive layer being constituted by a resistive material shaped according to an elongated pattern forming a sequence of touch positions, and the elongated pattern having, at a connectable end of the sequence, a single terminal arranged to be coupled to a sense input of a detecting device, while an open end of the sequence opposite to the connectable end of the sequence remains unconnected, the detecting device being arranged to detect a resistance between the sense input and one of said touch positions that is touched by a user via a return capacitance constituted by the user and a mass element coupled to the detecting device.

The measures have the effect that the resistive layer needs only to be connected via the single terminal to the detecting device. This has the advantage that the construction of the touch sensor is simplified, and is more flexible with regards to the shape and size of an object on which the touch sensor is to be placed. For example the sensor may be integrated in textile for making a garment, and requires only a single connection from the location of the sensor to the detecting device.

The invention is also based on the following recognition. The document US 2005/0052429 describes a sensor having resistive elements, which require to be coupled to respective detecting channels at both ends. The position of the finger is detected by comparing the channels at both ends. Balancing the results from both ends is required to suppress disturbances and eliminate the effect of the unknown return capacity. The inventors have seen that it is possible to form a touch sensor by an open-ended pattern having a resistance coupled at one side to a sensitive detecting circuit. Surprisingly the effect of the unknown return capacity from a single detecting channel can be eliminated in the detecting circuit, and the resistance differences between various touch positions along the pattern are detectable with sufficient accuracy.

In an embodiment of touch sensor the resistive layer is shaped according to the elongated pattern in which the active resistance increases more than proportional to the distance to the single terminal. This has the effect that the relative resistance between touch positions at regular intervals along the pattern increases more than proportional. This has the advantage that the relative difference between touch positions near the open end is sufficiently large to be reliably detected.

In an embodiment of touch sensor the resistive layer is shaped according to the elongated pattern having a discrete number of touch areas. Advantageously a number of separate buttons or control elements, e.g. a numerical keyboard, may be formed. In particular the elongated pattern may be shaped to have relatively broad parts at the touch areas and relatively small intermediate parts between the touch areas. This has the advantage that the resistance between the touch areas is relatively high, allowing a better separation between signals of different touch areas.

In an embodiment of touch sensor the resistive layer is shaped according to the elongated pattern having a resistance difference between each subsequent touch area, and is arranged to have the resistance differences increase towards the open end. This has the advantage that the relative resistance difference between subsequent touch areas toward the open end is less reduced compared to a pattern having equal resistances between touch areas.

Further preferred embodiments of the device and method according to the invention are given in the appended claims, disclosure of which is incorporated herein by reference.

BRIEF DESCRIPTION OF THE DRAWINGS

These and other aspects of the invention will be apparent from and elucidated further with reference to the embodiments described by way of example in the following description and with reference to the accompanying drawings, in which.

In the Figs. elements, which correspond to elements already described have the same reference numerals.

DETAILED DESCRIPTION OF EMBODIMENTS

Figure 1:
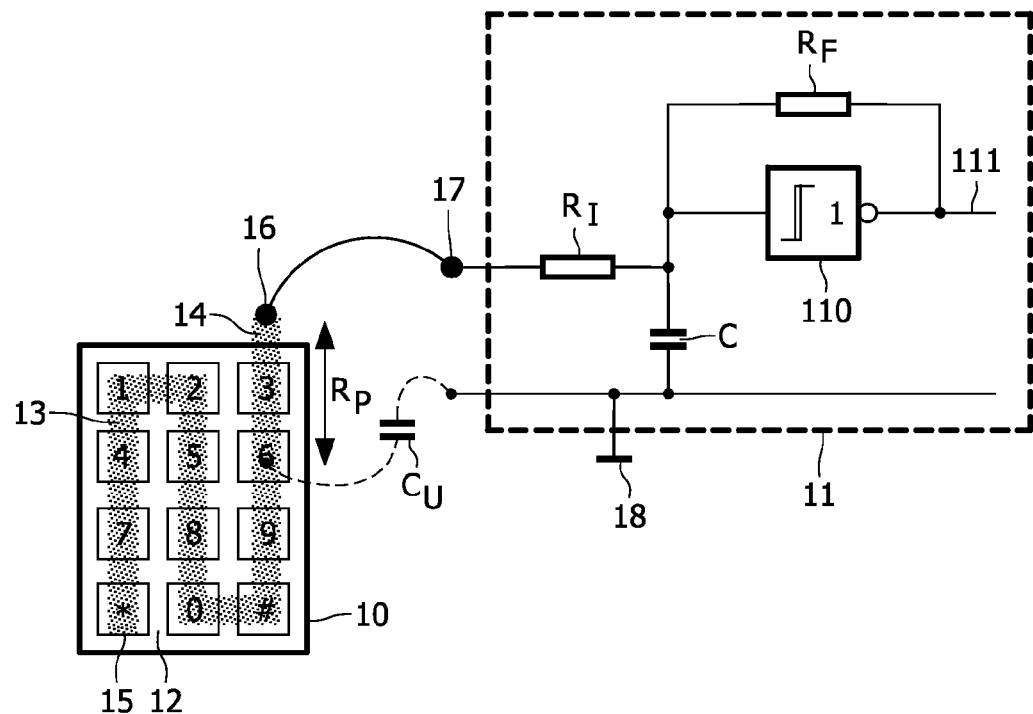
FIG. 1 shows a touch sensor and a detecting device.

FIG. 1 shows a touch sensor and a detecting device. The touch sensor 10 has a support layer 12 of an insulating material and a resistive layer 13 applied to the support layer. The resistive layer is formed by a resistive material shaped according to an elongated pattern forming a sequence of touch positions. The Fig. shows a sequence of a numerical keyboard, whereas the elongated pattern has the from of a strip passing along the digits in a predefined order (*, 7, 4, 1, 2, 5, 8, 0, #, 9, 6, 3).

It is noted that the layout of the keypad shown in the Fig. is not part of the resistive strip. It is a layout provided on the support layer on top of the resistive layer, which visually informs the user of the user interface.

The strip has, at a connectable end 14 of the sequence, a single terminal 16 arranged to be coupled to a sense input 17 of a detecting device 11. The other end of the strip, called the open end 15 of the sequence opposite to the connectable end of the sequence, remains unconnected. In a practical embodiment a strip of 0.5 cm width of a material having a resistance of 400 ohm/square may be used, which at a length of 34 cm has a total resistance of (34/0.5)*400=27.2 kOhm.

As shown in this embodiment of the touch sensor the elongated pattern has a discrete number of touch areas. Various patterns may be used to constitute user interface elements, e.g. a number of buttons or active areas for touch control of electronic or electromechanical devices, or to provide a touch sensitive surface to such devices, for example near or on a display screen. Amongst others a continuous part of the pattern may be used to form a continuous, i.e. substantially analog, control element, for example for controlling a volume of a device or a position of a cursor or a mechanical component.

In an embodiment of the touch sensor the elongated pattern is shaped to constitute a user interface for a mobile device. For example the touch sensor may at least partly control functions of a mobile phone, a media player or a personal digital assistant. Thereto the touch sensor may be connected to the mobile device, or may be coupled via a wired or wireless interface like Bluetooth. The touch sensor may be a secondary user interface, to be in addition to control elements on the device itself. In a further embodiment the touch sensor may form a user interface for an electronic device, in particular a keyboard or touch sensitive display. For example a flexible material may be used for the support layer providing a foldable keyboard. A display screen may be provided with one or more elongated strips made of a transparent, resistive material.

The detecting device 11 has a detecting circuit to detect an active resistance Rp, which active resistance is formed between the single terminal 16 and one of said touch positions that is touched by a user via a return capacitance Cu. The return capacitance is formed between the touch area and a mass element 18 coupled to the detecting device, in particular via the user, as is explained below in detail.

The detecting circuit as shown has an active element 110, e.g. a Schmitt trigger logical inverter having a hysteresis on the input. An output 111 of the active element provides a frequency that is dependent on the active resistance as follows. The active element is shown to have feedback resistor $R_F$ from output to input, and a capacitance C from input to mass, and a predefined serial input resistor $R_I$. The output generates a predetermined frequency when no touch area is touched, as determined $R_F$ and C. When the user touches the touch area a return capacitance is formed by the finger of the user and the area of the strip at close distance of the finger, via the body of the user, to a subsequent capacitance of the user's body to the mass element 18. It is noted that the mass element may actually be constituted by intermediate capacitances, e.g. a ground plane of a building and the capacitance of the building to a mass plane of the detecting circuit.

In an embodiment the detecting device is provided with a metal housing, which at least partly encloses the components of the detecting circuit, and which is connected to a ground level of the detecting circuit for constituting the mass element 18. The optimal housing is a Faraday cage, which for example may be formed by textile impregnated or coated by a conductive material. Alternatively the detecting device may have an electronic circuit board, in particular a multilayer circuit board, having a ground plane for constituting the mass element. Notably the ground plane is at least one order of magnitude larger than any circuit parts or connections constituting the sense input. In a preferred embodiment the ground plane is arranged to be located between the sensitive circuit parts or connections constituting the sense input and the body of the user. In practice a ground plane of a few $cm^2$ has been shown to be sufficient.

In an embodiment of the touch sensor, the active resistance increases more than proportional to the distance to the single terminal. The active resistance for a respective touch area is the resistance of the part of the strip 13 that is located between the single terminal 16 and the touch area. If a material with predetermined conductivity is used to form the elongated pattern having a constant width, the relative change of Rp for subsequent touch areas decreases proportional to the distance. The relative change is used to discriminate between the various touch positions, e.g. by measuring the frequency at the output 111. The sensor may be arranged to have increasing resistance, for example by decreasing the thickness of the resistive layer 13 along the pattern towards the open end 15, or by decreasing the width of the pattern.

Figure 2:
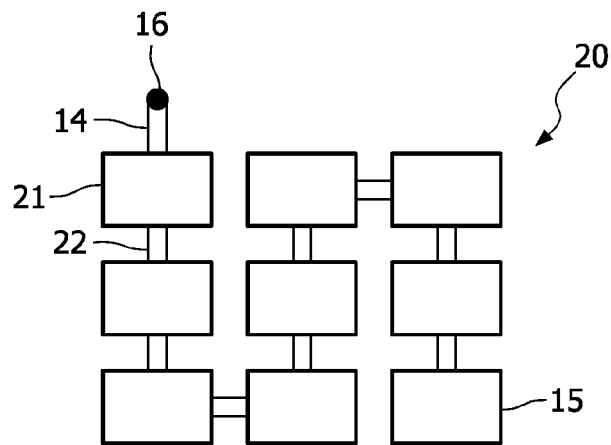
FIG. 2 shows a touch sensor having a shaped, elongated pattern.

FIG. 2 shows a touch sensor having a shaped, elongated pattern. The Fig. shows a touch sensor where the elongated pattern 20 is shaped to have relatively broad parts 21 at the touch areas and relatively small intermediate parts 22 between the touch areas. The broad parts 21 provide a better capacitive coupling to the touching object, e.g. the user's finger. Assuming that a single resistive material of constant conductance is used, the broad part will have a relatively low resistance, which decreases any differences in the active resistance resulting from the user touching the area not exactly centered. Furthermore, the relatively small intermediate parts 22 will have a relatively high resistance, clearly defining the differences in active resistance. Hence the elongated pattern 20 has a controlled resistance difference between each subsequent touch area. The resistance differences result in different detecting signals that can be reliably discriminated. To improve discrimination the resistive layer may have the resistance differences increase towards the open end 15.

In a practical embodiment a single layer of a flexible material, for instance a fabric, forms a support layer onto which a resistive material is applied, e.g. by printing, coating or affixing a second material cut-out in a selected pattern. By using the flexible material onto which a flexible resistive layer is applied, no conductive threads or wires need to be integrated, and thus the stretch ability and/or flexibility is not reduced. For example the support layer may be woven polyester coated with a suitable resistive material like PolyPyrrole, commercially available as Contex from Marktek Inc. Such a resistive material has a certain resistance based on the dimensions of a pattern as shaped. Alternatively resistive threads, wires or strips may be integrated in the material of the support layer. The flexible material with integrated resistive material is the only layer required.

A chain is created by means of capacitive coupling of a user's finger to the location on the pattern, and the active resistance $R_P$ of the section of the pattern to an end terminal. The terminal is connected to a measuring device, while the other end of the resistor is left open. If a user places a finger above the open end, the chain is completed via the body of the user having a capacitive coupling to a mass element of the detecting device. By means of capacitive coupling, the finger of the user, in close vicinity of the unconnected resistor end, will complete a circuit between the open resistor end and the ground of the circuitry. Detecting a finger position on the pattern, for instance a keypad, is possible because different positions on the sensor will all represent a different value for $R_P$, which can be detected by the measuring device.

Note that no contact to the pattern, and no pressure, is needed for the capacitive coupling to occur. Therefore the sensor does not require force to be applied. However, the applied pressure can be detected to some extend, because pressure influences the value of the return capacitance $C_U$. The detecting circuit may be arranged to separately detect the resistance $R_P$ and the impedance of $C_U$, for example by using a Wheatstone bridge and supplying various frequencies, and/or detecting a phase angle due to $C_U$.

Figure 3:
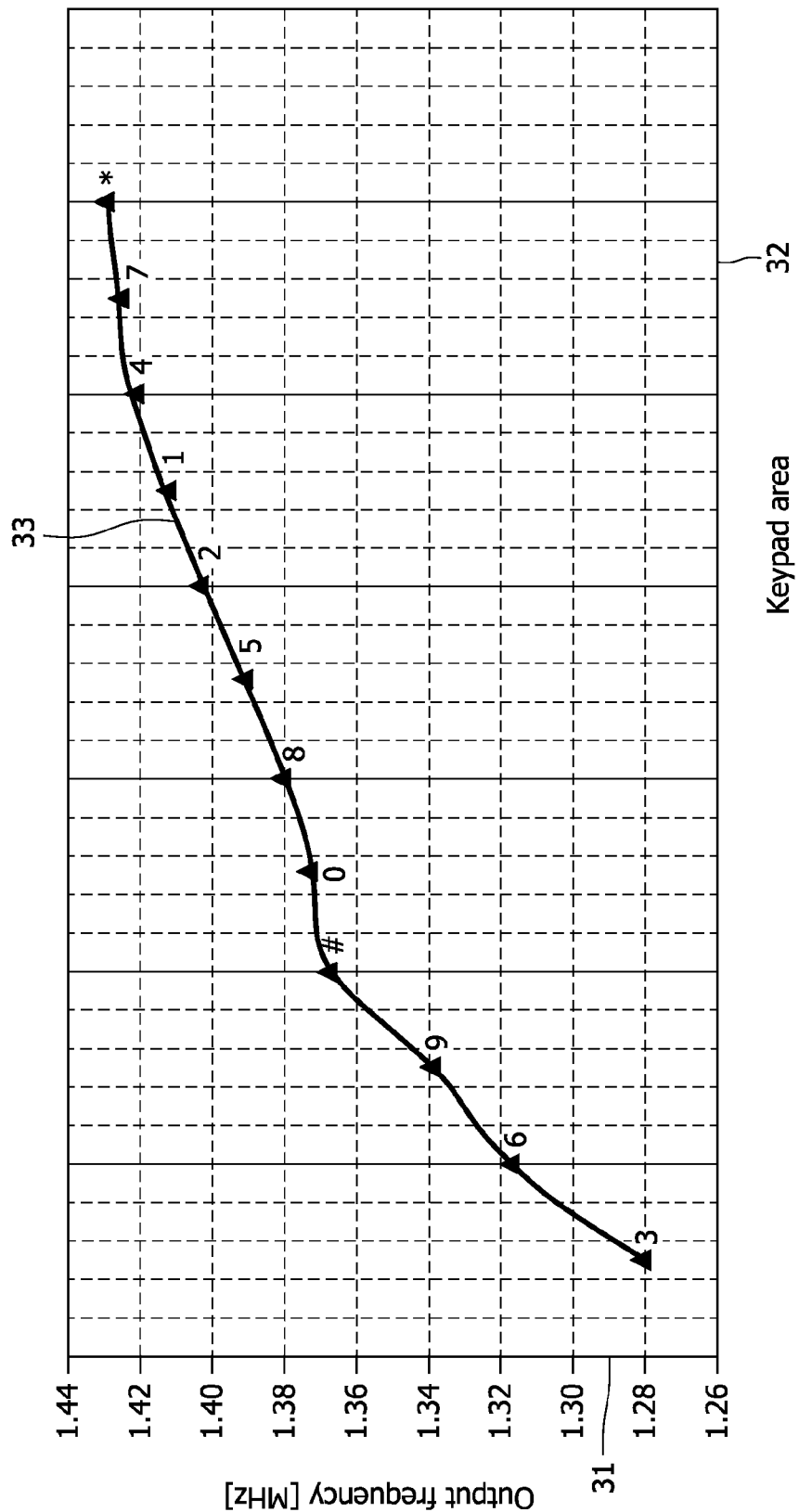
FIG. 3 shows frequency depending on touched areas.

FIG. 3 shows frequency depending on touched areas. The Fig. shows a curve 33 showing the relation between output frequency along a vertical axis 31 and keypad area, as touched, on a horizontal axis 32. A keypad layout, linear strip of resistive material and detecting circuit as shown in FIG. 1 have been used. Note that the graph is only an example, and that the values depend on the layout of the keyboard (geometry of resistive material), and the values of the several components in the detecting circuit. The graph does show a proof of the principle.

In an embodiment the detecting circuitry is arranged for calibrating the detection levels. For calibrating the touch sensor the user may be requested to touch a few touch areas, e.g. the first and last (3 and * in the example), or an intermediate one (e.g. 0 in the example). The calibration may be requested by a device that is coupled to the touch sensor, e.g. a mobile phone at the time of making the link to the touch sensor, or at power up, or at first use.

Figure 4:
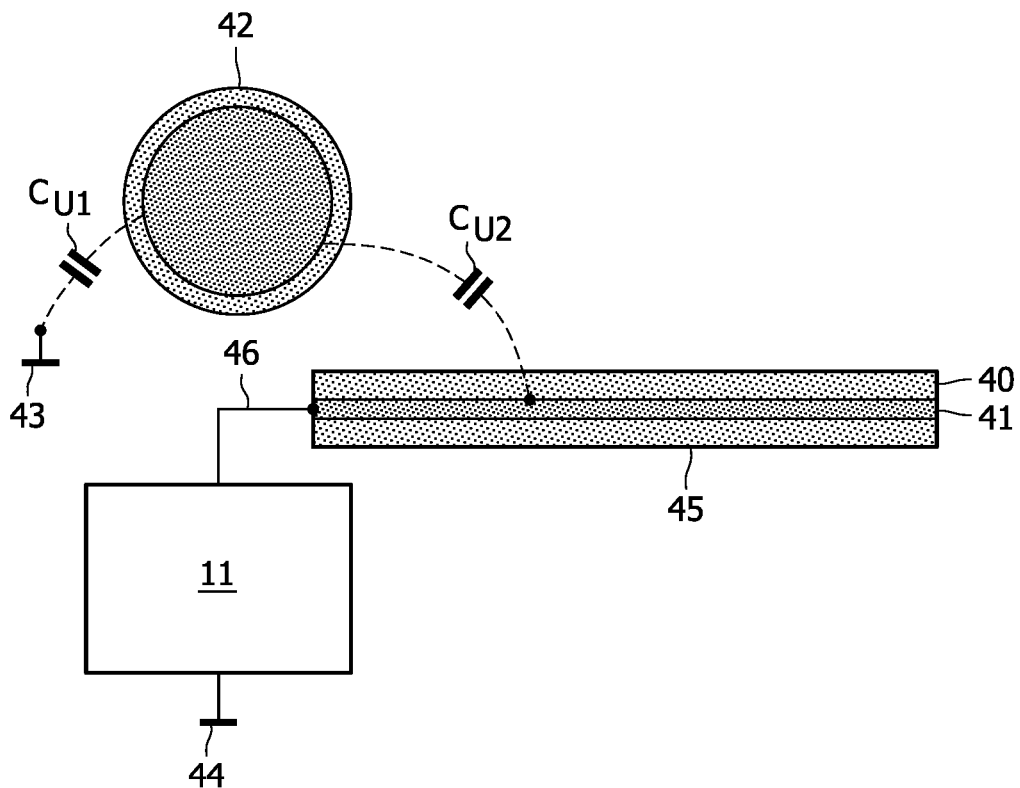
FIG. 4 shows capacitive coupling to a touch sensor.

FIG. 4 shows capacitive coupling to a touch sensor. The basic diagram of the capacitive coupling as used in the touch sensor 45 is shown. The sensor has an insulating support layer 40 and a resistive layer 41, which has a single terminal 46 coupled to a sense input of a detecting circuit 11. A circle 42 represents the human body, i.e. the object that is touching the sensor. The outer annular area represents the skin of the body, and the inner part represents the fluids inside the human body.

The capacitive coupling of the body in the circuitry is realized in steps. First, the fluids inside the human body are coupled capacitively to the ground potential of the electronic circuit ($C_{U1}$ in the Fig.). Thereto the detecting circuit has a mass element 44, which may be capacitively coupled to the touching body 42 directly. The body 42 may be also coupled to a ground plane 43, e.g. the floor or earth, which is subsequently coupled to the mass element 44. Secondly, when the user places a finger above a certain area of the resistive material the fluids inside his/her body will couple capacitively to this resistive material ($C_{U2}$ in the Fig.).

It is noted that the resistivity of the human skin, which is typically several mega ohms, and at best several hundreds of kilo ohms, does not affect the detection. The inventors have shown that the capacitive coupling is to the fluids inside the human body, which have a much lower resistance compared to the skin of a person. For estimating the coupling as used here, the resistance of the Electro Static Discharge [ESD] human body model may be assumed. This resistance is 1.5 kilo ohm. Hence the total resistance of the resistive material should be selected to be substantially higher. Subsequently 1.5 kilo ohm will not cause problems during measuring a position. Besides which it is present for all positions, and will therefore only cause an offset.

Figure 5:
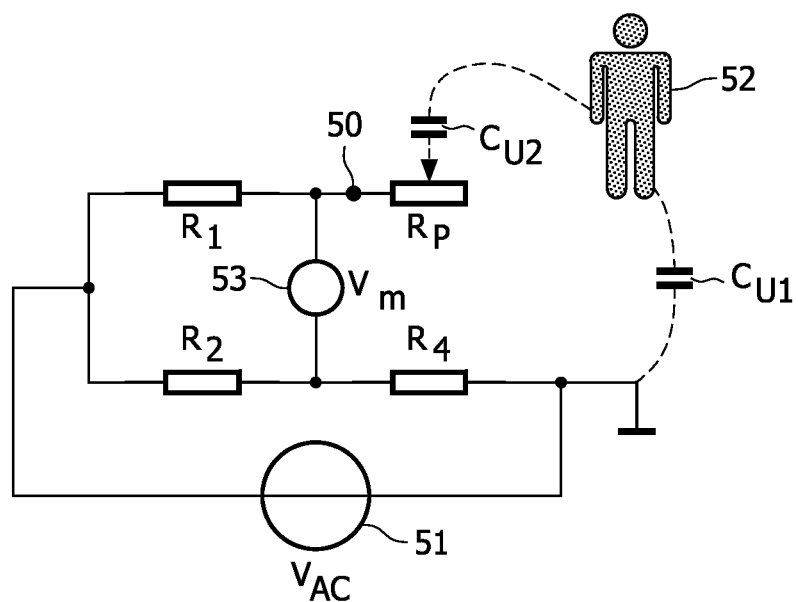
FIG. 5 shows a detecting circuit for detecting impedance.
Figure 6:
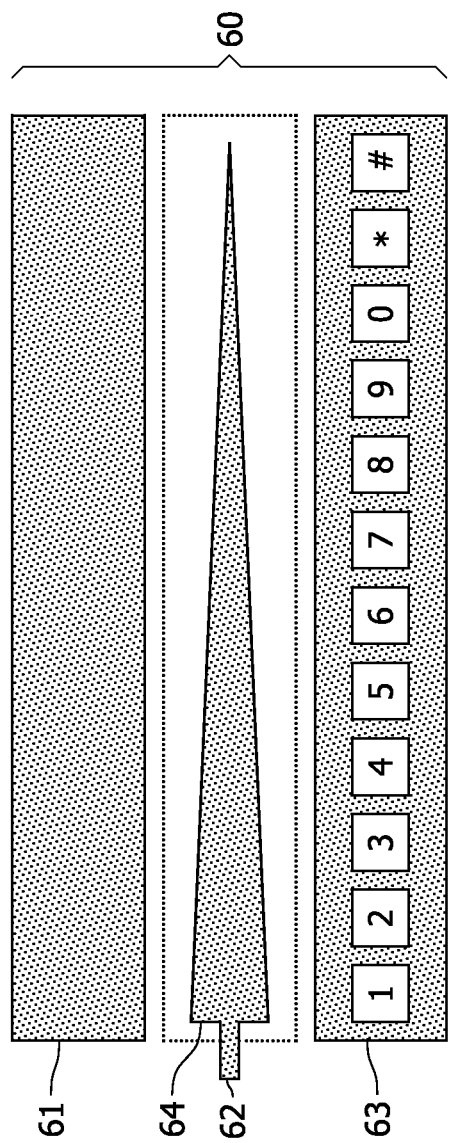
FIG. 6 shows a touch sensor having an increasing resistivity.

FIG. 5 shows a detecting circuit for detecting impedance. The Fig. schematically shows a measuring circuit based on a Wheatstone bridge. The detecting circuit has a sense input 50 connected to the single terminal of the touch sensor, e.g. terminal 62 as shown in FIG. 6. A resistor $R_P$ represents the active resistance of the touch sensor that is touched by a person 52. The capacitive chain to ground level is represented by capacitances $C_{U1}$ and $C_{U2}$. The resistors R1, R2 and R4 constitute the further branches of the bridge. It is noted that the branches may include further components to generate a suitable impedance. A measuring frequency signal is provided by a source $V_{AC}$ 51, and a measuring voltage $V_m$ 53 is detected at the bridge.

FIG. 6 shows a touch sensor having an increasing resistivity. The touch sensor 60 has three layers, a bottom layer 61, a resistive layer 64 and a top layer 63 representing a layout of a user interface, e.g. a numerical keyboard. It is noted that the resistive layer has a terminal 62 for connecting to the sense input 50 of the detecting circuit. The Fig. shows a decrease of the resistive material, i.e. an increase in resistance, from the first button "1" at the terminal end towards the last button "#" at the open end. Note that the decrease may be formed by reducing the thickness, width and/or conductivity (the resistance/square) of the resistive material in layer 64. Due to the decrease the absolute resistance difference from button to button increases.

The increase in resistance difference may also be achieved by a layout of the resistance layer, where intermediate sections between the subsequent touch areas have increasing lengths, and/or decreasing widths. For example in a layout having three buttons, the first button laying at x, the first intermediate section having length x, and the second intermediate section having length 2x. The resistance differences then are R−2R−4R.

If a strip has the same width all along the keyboard, the sensitivity for the last part of the keyboard would be less than the sensitivity of the first part of the keyboard. The reasoning behind this is as follows. The resistive material has a certain resistance per square. If the strip is the same width all over, key "1" would represent R. Key "2" would represent 2R, key "3" 3R and so on. This means that for each next key the influence would be R compared to the previous key. However, the relative influence of R becomes smaller and smaller compared to the total resistance. For instance touching the "#" key instead of the "*" key means 12R instead of 11R. Thus, the difference is $\frac{1}{12}$. The difference between key "1" and "2" means going from R to 2R. Thus, a strip with the same width all along its length will have a high sensitivity for the first keys, but a low sensitivity for the last keys. This can be observed in FIG. 3. Hence the relative difference does not decrease as much as it would using a linear strip. In an embodiment the decrease may be dimensioned such that the relative difference remains constant.

Figure 7:
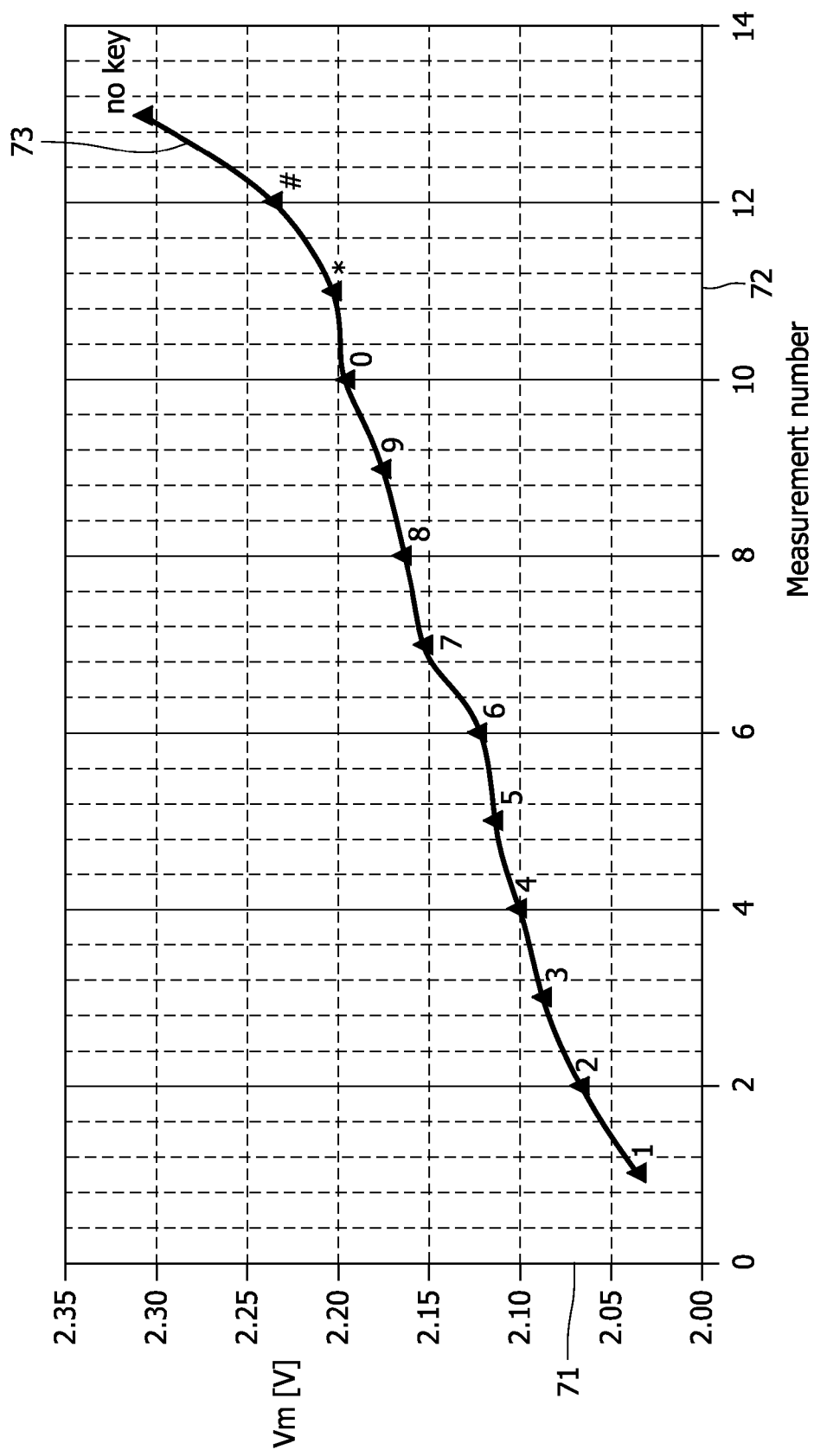
FIG. 7 shows voltage depending on touched areas.

FIG. 7 shows voltage depending on touched areas. The Fig. shows a curve 73 showing the relation between measuring voltage along a vertical axis 71 and keypad area, as touched, on a horizontal axis 72. A keypad layout and touch sensor having an increasing resistance as shown in FIG. 6 has been used, and a detecting circuit as shown in FIG. 5. The values used are:

R1=R2=18 k ohm
$V_{AC}$=10 $V_{PP}$ (peak to peak) with f=100 kHz
R4=200 k ohm

The curve 73 shows different voltages corresponding to different touch areas. Note that the points (apart from "no key") have a more linear relation than the points in FIG. 3. Thus, increasing the sensitivity by narrowing the strip is achieved.

It is noted that in practical embodiments a much higher frequency, e.g. in the range of 1-100 Mhz, may be used to reduce the effect of the return capacitance ($C_{U1}$ and $C_{U2}$ in FIG. 5). Furthermore, a phase shift of the measuring signal $V_m$ with respect to the source voltage $V_{AC}$ may be detected for detecting the actual return capacitance, e.g. by calculating the impedances based on the frequency and phase shift. When the return capacitance is detected, its effect on the measurements of the active resistance may be eliminated, e.g. to improve reliability, or to reduce or obviate the need for calibration. By taking a series of measurements and applying signal processing, the changing value of the return capacitance versus time may be detected. Based on the changing value the movement of the user may be estimated, e.g. the amount of pressure or if the user swiftly taps or slowly presses the respective touch area.

It is to be noted that the invention may be implemented (partly) in hardware and/or software, using programmable components. Although the invention has been mainly explained by embodiments using textile touch sensors and numerical keypads, the invention is also suitable for any type of user control element that is to be activated by touch.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' or 'units' may be represented by the same item of hardware or software, and a processor may fulfill the function of one or more units, possibly in cooperation with hardware elements. Further, the invention is not limited to the embodiments, and the invention lies in each and every novel feature or combination of features described above.

The invention claimed is:

1. A touch sensor comprising:
    a foldable support layer of an insulating material and a single flexible resistive layer applied to the support layer, wherein the flexible support layer is a single layer of flexible material onto which the flexible resistive layer is applied,
    the single flexible resistive layer being constituted by a resistive material shaped according to an elongated pattern forming a sequence of touch positions, and the elongated pattern having, at a connectable end of the sequence, a single terminal arranged to be coupled to a sense input of a detecting device, while an open end of the sequence opposite to the connectable end of the sequence remains unconnected, wherein a difference in resistive value between adjacent touch positions increases more than a resistive value that increases proportional to a distance to the single terminal, wherein intermediate sections between subsequent touch areas have one of: increasing lengths and decreasing widths;
    the detecting device being arranged to detect an active resistance ($R_P$) between the single terminal and one of said touch positions that is touched by a user via a return capacitance constituted ($C_U$) by the user and a mass element coupled to the detecting device; and
    the detecting device being arranged to calibrate the touch sensor by requesting that a user touch at least two different touch positions from the sequence of touch positions.

2. The touch sensor as claimed in claim 1, wherein the single flexible resistive layer is shaped according to the elongated pattern in which the active resistance ($R_P$) increases more than proportional to the distance to the single terminal.

3. The touch sensor as claimed in claim 1, wherein the single flexible resistive layer is shaped according to the elongated pattern having a discrete number of touch areas.

4. The touch as claimed in claim 3, wherein the single flexible resistive layer is shaped according to the elongated pattern having relatively broad parts at the touch areas and relatively small intermediate parts between the touch areas.

5. The touch sensor as claimed in claim 3, wherein the single flexible resistive layer is shaped according to the elongated pattern having a resistance difference between each subsequent touch area, and is arranged to have the resistance differences increase towards the open end.

6. The touch sensor as claimed in claim 1, wherein the single flexible resistive layer is shaped according to the elongated pattern to constitute at least part of:
    a user interface for a mobile device, in particular a mobile phone, a media player or a personal digital assistant, a user interface for an electronic device, in particular a keyboard or touch sensitive display.

7. A method of manufacturing a touch sensor, the method comprising the steps of:
    providing a foldable support layer of an insulating material;
    applying a single flexible resistive layer to the support layer, wherein the support layer is a single layer of flexible material onto which the single flexible resistive layer is applied,
    the single flexible resistive layer constructed by shaping a resistive material according to an elongated pattern forming a sequence of touch positions, wherein a difference in resistive value between adjacent touch positions increases more than a resistive value that increases proportional to a distance to the single terminal, wherein intermediate sections between subsequent touch areas have one of: increasing lengths and decreasing widths, and providing, at a connectable end of the sequence, a single terminal arranged to be coupled to an input of a detecting device, while an open end of the sequence opposite to the connectable end of the sequence remains unconnected, the detecting device being arranged to detect a resistance between the single terminal and one of said touch positions that is touched by a user via a return capacitance constituted by the user and a mass element coupled to the detecting device, and the detecting device being arranged to calibrate the touch sensor by requesting that a user touch at least two different touch positions from the sequence of touch positions.

8. The method as claimed in claim 7, wherein the method comprises at least one of:

a step of shaping a resistive material according to the elongated pattern and attaching the shaped resistive material to the single flexible support layer;

a step of printing a resistive pattern on the single flexible support layer;

a step of embedding the resistive material in textile by inserting resistive threads.

9. A detecting device for cooperating with a touch sensor that comprises:

a foldable support layer of an insulating material, and a single flexible resistive layer applied to the single flexible support layer, wherein the support layer is a single layer of flexible material onto which the flexible resistive layer is applied the single flexible resistive layer being constituted by a resistive material shaped according to an elongated pattern forming a sequence of touch positions, and the elongated pattern having, at a connectable end of the sequence, a single terminal arranged to be coupled to a sense input of a detecting device, while an open end of the sequence opposite to the connectable end of the sequence remains unconnected, wherein a difference in resistive value between adjacent touch positions increases more than a resistive value that increases proportional to a distance to the single terminal, wherein intermediate sections between subsequent touch areas have one of: increasing lengths and decreasing widths, the detecting device being arranged to detect a resistance between the sense input and one of said touch positions that is touched by a user via a return capacitance constituted by the user and a mass element coupled to the detecting device, and the detecting device being arranged to calibrate the touch sensor by requesting that a user touch at least two different touch positions from the sequence of touch positions.

10. The detecting device as claimed in claim 9, wherein the device comprises at least one of:

a frequency generating circuit coupled to the sense input for detecting a frequency in dependence of the active resistance;

an impedance detecting circuit coupled to the sense input for detecting an impedance in dependence of the active resistance.

* * * * *